(12) United States Patent
Shibata (10) Patent No.: US 10,104,789 B2
(45) Date of Patent: Oct. 16, 2018

(54) DISPLAY DEVICE, ELECTRONIC DEVICE, AND SUBSTRATE ADJUSTING METHOD

(71) Applicant: Sony Semiconductor Solutions Corporation, Kanagawa (JP)

(72) Inventor: Takahiro Shibata, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/447,690

(22) Filed: Mar. 2, 2017

(65) Prior Publication Data

US 2017/0181296 A1    Jun. 22, 2017

Related U.S. Application Data

(63) Continuation of application No. 14/665,249, filed on Mar. 23, 2015, now Pat. No. 9,605,793.

(30) Foreign Application Priority Data

Mar. 31, 2014  (JP) .................................. 2014-071014

(51) Int. Cl.
  *H02B 1/01* (2006.01)
  *H05K 5/00* (2006.01)
  *H05K 7/20* (2006.01)
  *F16M 13/02* (2006.01)
(52) U.S. Cl.
  CPC ........... *H05K 5/0017* (2013.01); *F16M 13/02* (2013.01); *H05K 7/20963* (2013.01)
(58) Field of Classification Search
  CPC ... H05K 5/0017; H05K 7/20963; F16M 13/02

USPC ......................................................... 361/831
See application file for complete search history.

(56) References Cited

U.S. PATENT DOCUMENTS

| | | | |
|---|---|---|---|
| 6,154,362 A * | 11/2000 | Takahashi | G09F 9/33 257/E25.028 |
| 6,926,375 B2 | 8/2005 | Nagamine et al. | |
| 7,864,516 B2 * | 1/2011 | Lee | H05K 5/0017 345/1.3 |
| 8,174,848 B2 | 5/2012 | Park et al. | |
| 8,648,774 B2 | 2/2014 | Kline et al. | |
| 8,824,124 B1 | 9/2014 | Carlson et al. | |
| 2007/0084978 A1 | 4/2007 | Martin et al. | |
| 2008/0265114 A1 | 10/2008 | Moscovitch | |
| 2010/0288524 A1 * | 11/2010 | Tagawa | H01J 29/87 174/50.5 |

(Continued)

FOREIGN PATENT DOCUMENTS

JP      2000-338899 A      12/2000

*Primary Examiner* — Hung S Bui
(74) *Attorney, Agent, or Firm* — Wolf, Greenfield & Sacks, P.C.

(57) ABSTRACT

There is provided a display device including a jig that is provided with an insertion port into which a tip portion of an eccentric driver having the tip portion on an axis different from a central axis of a grip is inserted, a substrate that is provided with a long hole into which the grip is inserted, the long hole being long and narrow, a position of the substrate relative to the jig being movable within a predetermined movable range by rotation of the eccentric driver, the tip portion and the grip of the eccentric driver being inserted, and a base position fixing unit that fixes the substrate to a predetermined base position within the movable range.

7 Claims, 11 Drawing Sheets

(56) References Cited

U.S. PATENT DOCUMENTS

2014/0153241 A1 6/2014 Templeton
2015/0276120 A1 10/2015 Shibata

\* cited by examiner

DISPLAY DEVICE, ELECTRONIC DEVICE, AND SUBSTRATE ADJUSTING METHOD

CROSS REFERENCE TO RELATED APPLICATIONS

This application is a continuation of and claims the benefit under 35 U.S.C. § 120 of U.S. patent application Ser. No. 14/665,249, titled "DISPLAY DEVICE, ELECTRONIC DEVICE, AND SUBSTRATE ADJUSTING METHOD," filed on Mar. 23, 2015 which claims the benefit of Japanese Priority Patent Application JP 2014-071014 filed Mar. 31, 2014, the entire contents of which are incorporated herein by reference.

BACKGROUND

The present technology relates to a display device, an electronic device, and a substrate adjusting method. More specifically, the present technology relates to a display device and an electronic device having a jig for adjusting the position of a substrate and a substrate adjusting method.

Heretofore, a display in which a plurality of display panels are arranged for the purpose of increasing the screen size has been sometimes used in a display device. For example, a part containing a substrate larger than a display panel and a plurality of display panels arranged on the substrate is used as one unit, and two or more of the units are connected, whereby a display having a large screen is manufactured. In this display, when the position of each unit shifts from the base position, an emission line and a dark line arise on the boundary of the units, which reduces the image quality.

Therefore, a display device has been proposed in which plate-like base plate portions projecting in a direction vertical to the substrates are provided on the substrates, a screw rod is inserted into a hole opened in each base plate portion of the adjacent substrates, and then both ends of the screw rod are fixed with a nut in order to adjust the position of the units (for example, JP 2000-338899A). When an operator rotates the screw rods, the positions of the units can be adjusted along the axial direction of the screw rods.

SUMMARY

According to the former technology described above, the adjustment amount when the screw rod is rotated by only the unit angle is determined based on the interval of screw grooves of the screw rod. When the adjustment amount per unit angle is excessively large, there is a possibility that the position may not be correctly adjusted. However, in order to change the adjustment amount, there is a necessity of removing the screw rod once, and then exchanging the same with another screw rod with a small screw groove interval, which increases working hours and man-hours therefor. Therefore, it is difficult to correctly adjust the positions of the substrates.

The present technology has been produced in view of such circumstances and aims at correctly adjusting the position of a substrate.

According to a first embodiment of the present disclosure, there is provided a display device including a jig that is provided with an insertion port into which a tip portion of an eccentric driver having the tip portion on an axis different from a central axis of a grip is inserted, a substrate that is provided with a long hole into which the grip is inserted, the long hole being long and narrow, a position of the substrate relative to the jig being movable within a predetermined movable range by rotation of the eccentric driver, the tip portion and the grip of the eccentric driver being inserted, and a base position fixing unit that fixes the substrate to a predetermined base position within the movable range. This produces an effect that the substrate is fixed at a predetermined base position.

According to the first embodiment, the substrate may have a rectangular shape. A plurality of the insertion ports may be arranged along a side of the substrate. The jig may be provided in each insertion port. This produces an effect that two or more of the insertion ports are arranged along the sides of the substrate, and the jig is provided in each insertion port.

According to the first embodiment, the plurality of insertion ports and a plurality of the jigs may be provided on each side of the substrate. This produces an effect that two or more of the insertion ports and the jigs are provided on each side of the substrate.

According to the first embodiment, the display device may further include a heat dissipation unit that dissipates heat generated in the substrate to an outside of the substrate. This produces an effect that the heat generated in the substrate is dissipated to the outside of the substrate.

According to the first embodiment, the display device may further include an external fixing unit that fixes the jig to a member at an outside of the substrate. This produces an effect that the jig is fixed to the member at the outside of the substrate.

According to the first embodiment, the display device may further include a display panel that is attached to the substrate, and a control unit that displays an image on the display panel. This produces an effect that an image is displayed on the display panel.

According to a second embodiment of the present disclosure, there is provided an electronic device including a jig that is provided with an insertion port into which a tip portion of an eccentric driver having the tip portion on an axis different from a central axis of a grip is inserted, a substrate that is provided with a long hole into which the grip is inserted, the long hole being long and narrow, a position of the substrate relative to the jig being movable within a predetermined movable range by rotation of the eccentric driver, the tip portion and the grip of the eccentric driver being inserted, and a base position fixing unit that fixes the substrate to a predetermined base position within the movable range. This produces an effect that the substrate is fixed to the predetermined base position.

According to a third embodiment of the present disclosure, there is provided a substrate adjusting method by an electronic device including a jig that is provided with an insertion port into which a tip portion of an eccentric driver having the tip portion on an axis different from a central axis of a grip is inserted, a substrate that is provided with a long hole into which the grip is inserted, the long hole being long and narrow, a position of the substrate relative to the jig being movable within a predetermined movable range by rotation of the eccentric driver, the tip portion and the grip of the eccentric driver being inserted, and a base position fixing unit that fixes the substrate to a predetermined base position within the movable range, the substrate adjusting method including inserting the tip portion into the insertion port and inserting the grip into the long hole, rotating the eccentric driver, the tip portion and the grip of the eccentric driver being inserted, and fixing, after the rotating, the substrate to the base position with the base position fixing unit. This produces an effect that the substrate is fixed to the predetermined base position.

The present technology can demonstrate an outstanding effect that the position of a substrate can be correctly adjusted. The effects described here are not necessarily limited and may be any effect described in the present disclosure.

BRIEF DESCRIPTION OF THE DRAWINGS

FIG. 5 includes FIGS. 5a and 5b showing an example of a plan view and a side view, respectively, of a jig in the first embodiment;

FIG. 6 includes FIGS. 6a and 6b showing an example of a side view and a cross sectional view, respectively, of an eccentric driver in the first embodiment;

DETAILED DESCRIPTION OF THE EMBODIMENTS

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted. The description is given in the following order.

1. First Embodiment (Example of adjusting position of substrate by rotation of eccentric driver)
2. Second Embodiment (Example of having heat dissipation unit and adjusting position of substrate by rotation of eccentric driver)

1. First Embodiment
Configuration Example of Display Device

Figure 1:
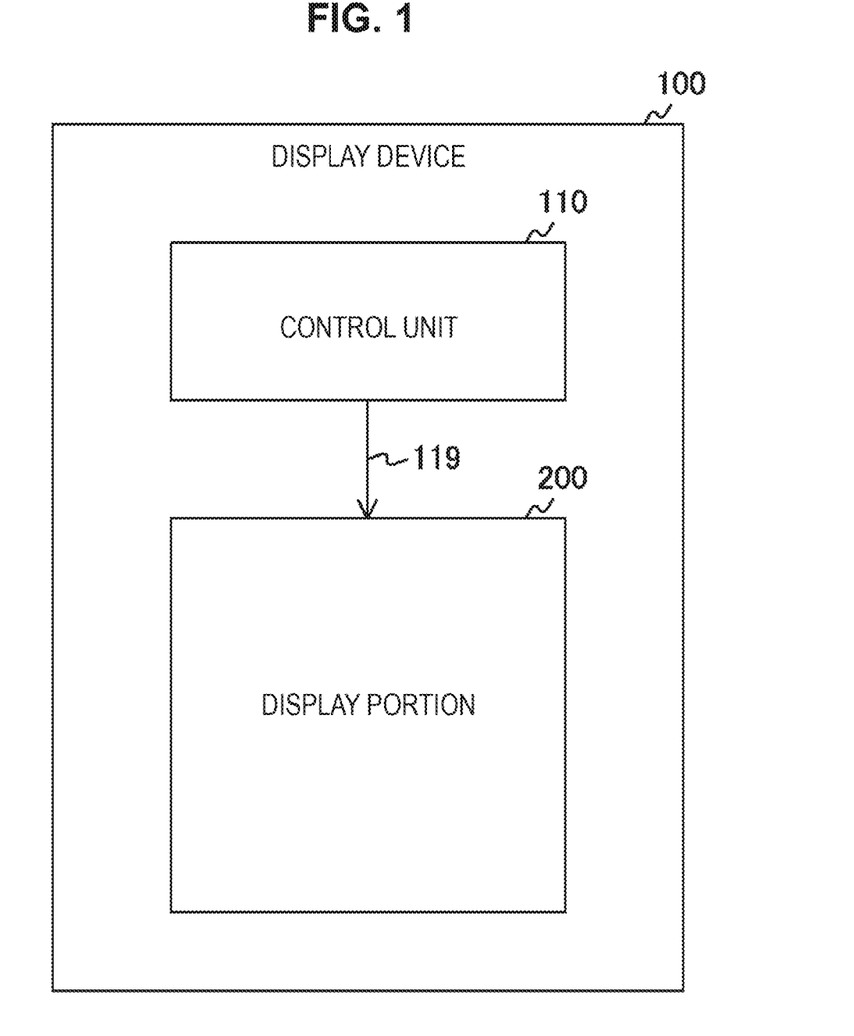
FIG. 1 is a block view illustrating a configuration example of a display device in a first embodiment.

FIG. 1 is a block view illustrating a configuration example of a display device 100 in a first embodiment. The display device 100 is a device which displays moving images and still images and has a control unit 110 and a display portion 200.

The control unit 110 controls the entire display device 100. The control unit 110 generates control signals, such as timing signals and pixel signals, and supplies the same to a display portion 200 through a signal line 119. Herein, the timing signals include a horizontal synchronizing signal and a vertical synchronizing signal, for example. The pixel signals include signals each indicating the gradation of each of R (Red), G (Green), and B (Blue), for example. The display portion 200 displays moving images and the like according to the control of the control unit 110.

Configuration Example of Display Unit

Figure 2:
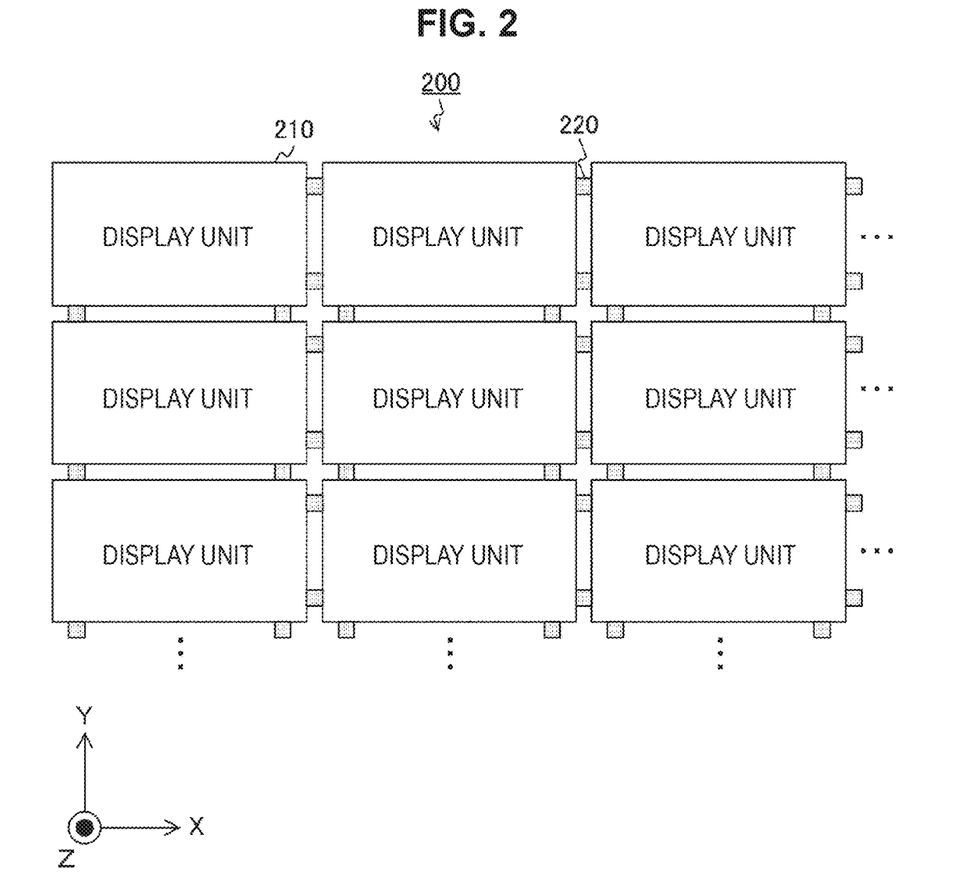
FIG. 2 shows an example of a plan view of a display portion in the first embodiment.

FIG. 2 shows an example of a plan view of the display portion 200 in the first embodiment. The display portion 200 has a plurality of display units 210, a plurality of jigs 220, and a case. In FIG. 2, the case is omitted.

The display unit 210 displays a part of an image. The display unit 210 has a rectangular display surface and is arranged in the shape of a two-dimensional lattice in the display portion 200. On the display surface of the display unit 210, a plurality of light emitting elements are arranged in the shape of a two-dimensional lattice. Hereinafter, an axis parallel to the long side of the display surface of the display unit 210 is defined as the X-axis and an axis parallel to the short side of the display surface is defined as the Y-axis. An axis orthogonal to the X-axis and the Y-axis is defined as the Z-axis.

The jigs 220 are instruments provided for finely adjusting the position of the display units 210. The jigs 220 are provided on each of the long side and the short side of the display unit 210, for example. The jigs 220 provided on the long side are provided for moving the display unit 210 in the direction orthogonal to the long side (i.e., Y-axis direction) to finely adjust the position. On the other hand, the jigs 220 provided on the short side are provided for moving the display unit 210 in the direction orthogonal to the short side (i.e., X-axis direction) to finely adjust the position.

Herein, it is desirable to provide two or more of the jigs 220 on each of the long side and the short side of the display unit 210. When an operator adjusts the positions of the display units 210 only by different adjustment amounts with the plurality of jigs 220 on the long side and the short side, the display units 210 can be inclined at a fixed angle around the Z-axis.

Configuration Example of Display Unit

Figure 3:
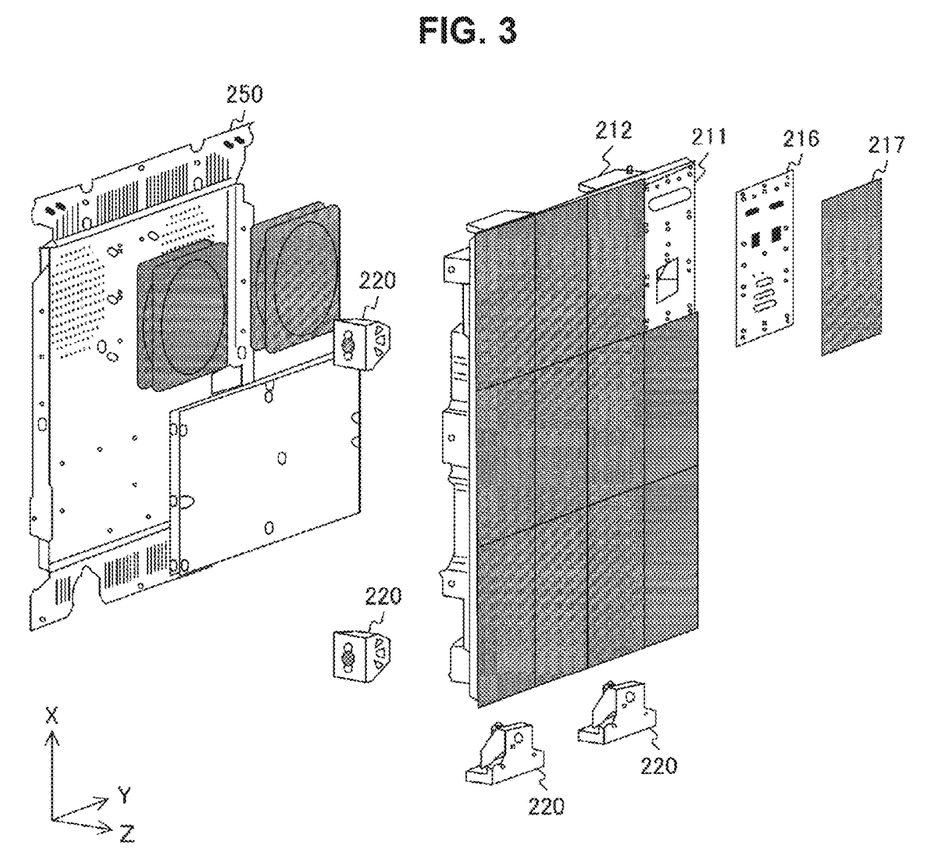
FIG. 3 shows an example of a perspective view of the display portion in the first embodiment.

FIG. 3 shows an example of a perspective view of the display portion 200 in the first embodiment. The display portion 200 has a sheet metal back lid 250, the plurality of display units 210, and the plurality of jigs 220. In FIG. 3, only one of the plurality of display units 210 is illustrated and a part of the sheet metal back lid 250 is illustrated.

The display unit 210 has a unit substrate 211, a plurality of panel attachment plates 216, and a plurality of display panels 217.

The unit substrate 211 is a rectangular substrate to which the panel attachment plates 216 and the display panels 217 are attached. With respect to the unit substrate 211, the surface to which the display panels 217 are attached is defined as the front surface and the other surface is defined as the back surface. On the back surface of the unit substrate 211, unit attachment units 212 projecting in a direction orthogonal to the back surface are provided near the sides thereof. The unit substrate 211 is an example of a substrate described in Claims.

The panel attachment plate 216 is a part for attaching the display panel 217 to the unit substrate 211. The display panel 217 displays a part of an image.

Although it is configured so that the unit substrates 211 and the jigs 220 are provided in the display device 100, the unit substrates 211 and the jigs 220 may be provided in an electronic device (lighting device or the like) other than the display device 100. When providing the same in a lighting device, a lighting panel is attached in place of the display panel 217.

Figure 4:
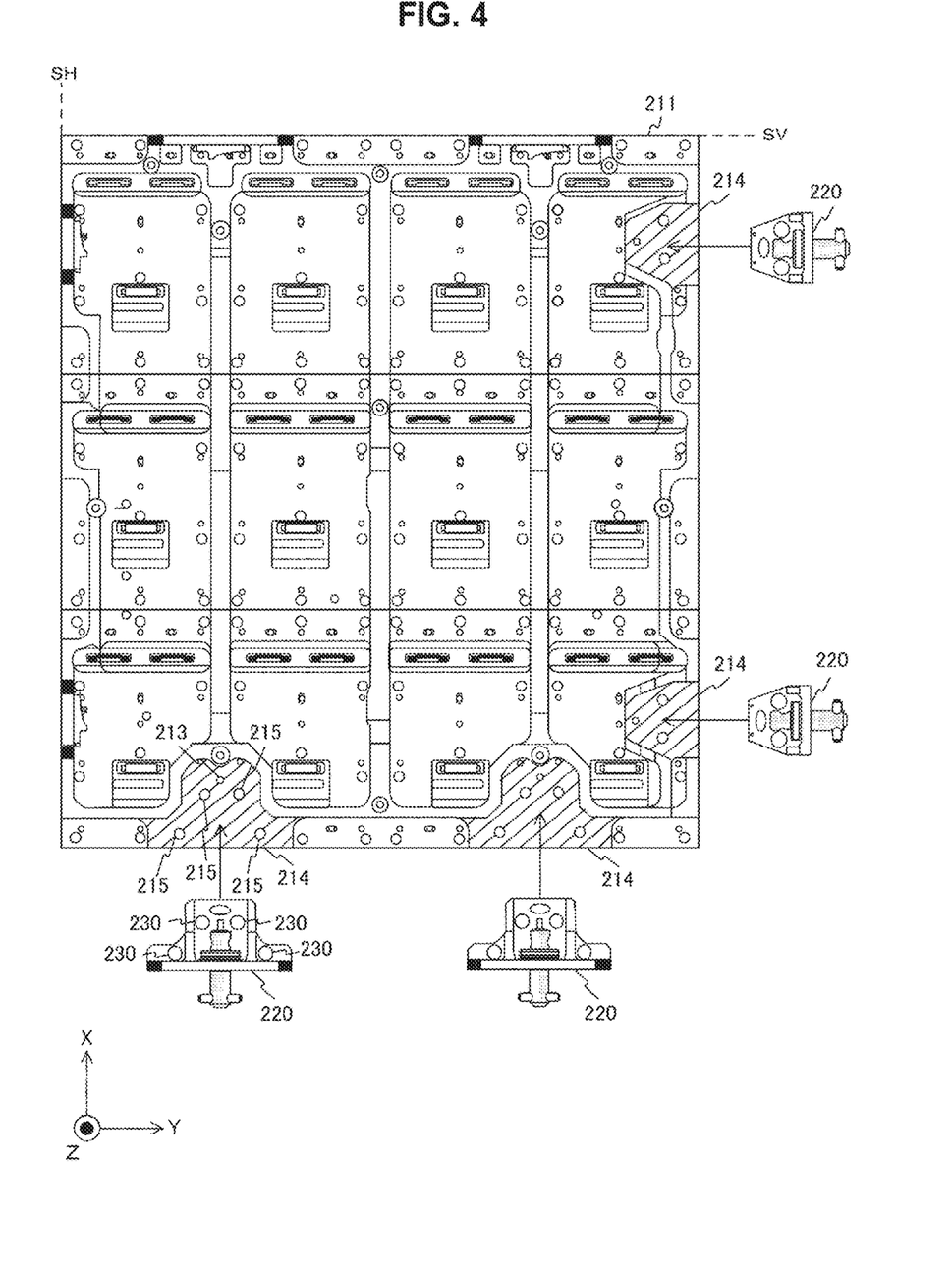
FIG. 4 shows an example of a back view of a unit substrate in the first embodiment.

FIG. 4 shows an example of the back view of the unit substrate 211 in the first embodiment. In the unit substrate 211, two jig attachment units 214 are provided on each of two sides orthogonal to each other.

The jig attachment unit 214 is a plane for attaching the jig 220. The jig attachment unit 214 is provided with a circular insertion port 213 and a plurality of screw holes 215. The insertion port 213 is a circular hole into which the tip portion of an eccentric driver described later is inserted. The screw hole 215 is a hole provided in order to fasten a screw.

In FIG. 4, a mechanical base line SV is a base line indicating the base position on the X-axis of the unit substrate 211. A mechanical base line SH is a base line indicating the base position on the Y-axis of the unit substrate 211. In the adjustment, the position is finely adjusted in such a manner that the short side of the unit substrate 211 is in agreement with the mechanical base line SV. The position is finely adjusted in such a manner that the long side of the unit substrate 211 is in agreement with the mechanical base line SH.

Configuration Example of Jig

Figure 5:
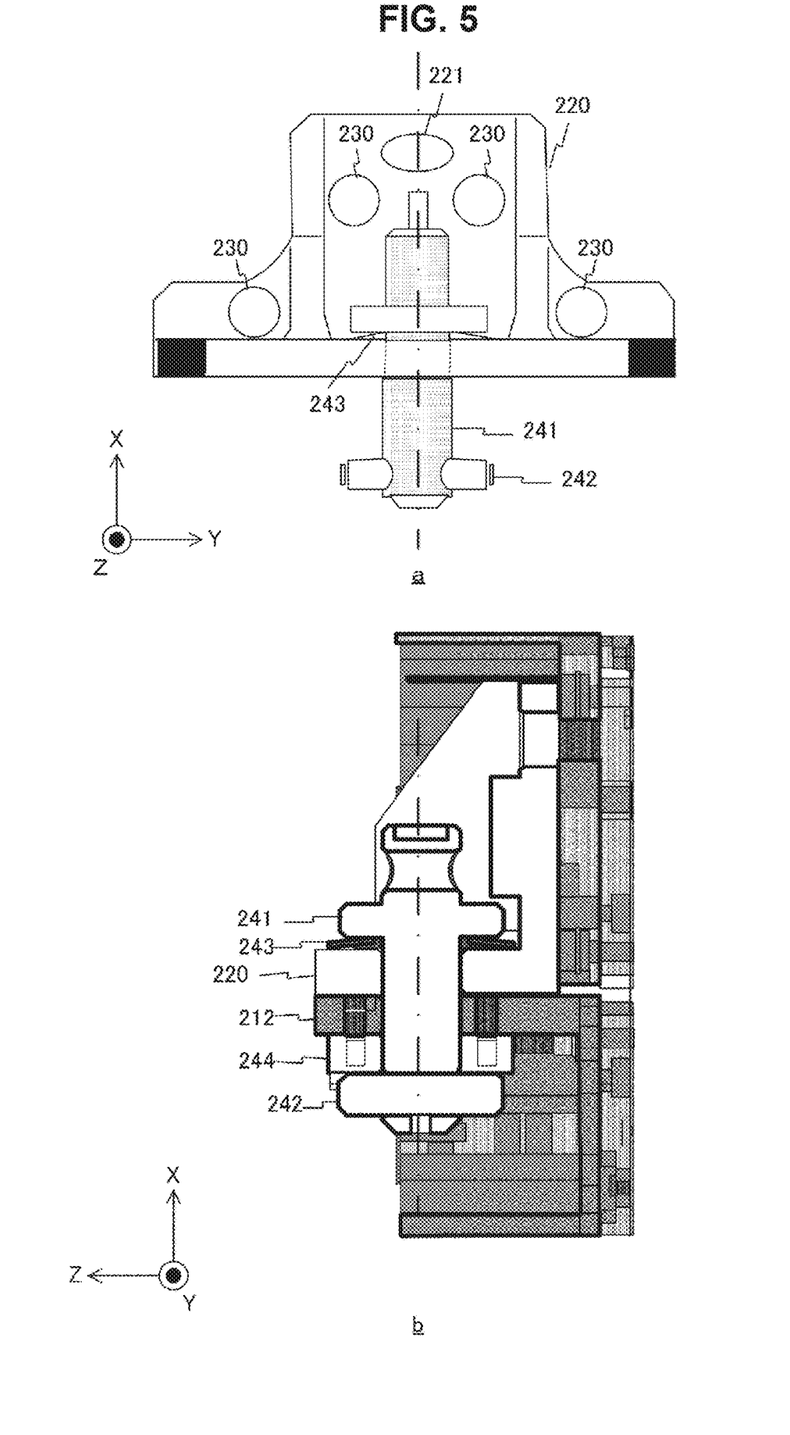

FIG. 5 includes FIGS. 5a and 5b showing an example of a plan view and a side view, respectively, of the jig 220 in the first embodiment. In FIG. 5, FIG. 5a shows an example of a plan view of the jig 220. In the jig 220, a long hole 221 is formed. To the jig 220, a plurality of screws 230, a shaft 241, and a spring 243 are attached.

The long hole 221 is a hole which is long and narrow along a direction orthogonal to the adjustment direction and is larger than the insertion port 213. The shape of the long hole 221 is an oval shape, for example. The shape of the long hole 221 is not limited to an oval hole insofar as the shape is a long and narrow shape and may be a rectangular shape, for example.

The screws 230 fix the unit substrate 211 at a predetermined position within the range of motion. The screws 230 penetrate the jig 220 in the Z-axis direction, and are fastened to the screw holes 215 of the unit substrate 211. When an operator loosens the screw 230, the unit substrate 211 can be moved within a fixed movable range in the minor axis direction of the long hole 221. An operator adjusts the position of the unit substrate 211 with eccentric drivers described later in the state where the screws 230 are loosened, and then the screws 230 are tightened. Then, the unit substrate 211 is fixed at a predetermined position (for example, base position) within the range of motion. The screw 230 is an example of a base position fixing unit described in Claims.

The shaft 241 is a cylindrical member in which a pin 242 is provided on one end. The shaft 241 is attached penetrating the jig 220 in the minor axis direction of the long hole 221 (for example, X-axis direction). The pin 242 is provided on one end farther from the long hole 221 in the shaft 241.

The spring 243 is an elastic body which makes the shaft 241 movable toward the long hole 221 along the axis direction of the shaft 241 by elastic energy.

FIG. 5b in FIG. 5 shows an example of a cross sectional view of the jig 220. The shaft 241 is attached penetrating the jig 220 and the unit attachment unit 212 of the adjacent unit substrate 211. Between the pin 242 of the shaft 241 and the unit attachment unit 212, a cam 244 is inserted. When the shaft 241 rotates at a fixed angle (for example, 90°) around the axis, the cam 244 engages with the pin 242.

An operator attaches the jig 220 to a certain unit substrate 211, and then attaches the spring 243 to the jig 220. Then, the operator attaches the shaft 241 penetrating the spring 243, the jig 220, the unit attachment unit 212 of the adjacent unit substrate 211, and the cam 244. When the operator rotates the shaft 241 at a fixed angle, the pin 242 and the cam 244 engages with each other as described above, so that the jig 220 is fixed to the adjacent unit substrates 211 by the elasticity of the spring 243. The jig 220 is fixed to the unit substrates 211 by the screws 230. Therefore, the adjacent two unit substrates 211 are connected by a clamp containing the shaft 241, the spring 243, and the cam 244, and the screw 230. The clamp containing the shaft 241, the spring 243, and the cam 244 is one example of an external fixing unit described in Claims.

When there is a necessity of exchanging the display unit 210 due to a failure occurring in the display unit 210, an operator simply may loosen the screws 230 and the clamp (241, 243, and 244). Thus, a clearance arises between the adjacent display units 210, so that the operator can easily remove and exchange the display unit 210. Therefore, maintenance is facilitated.

Figure 6:
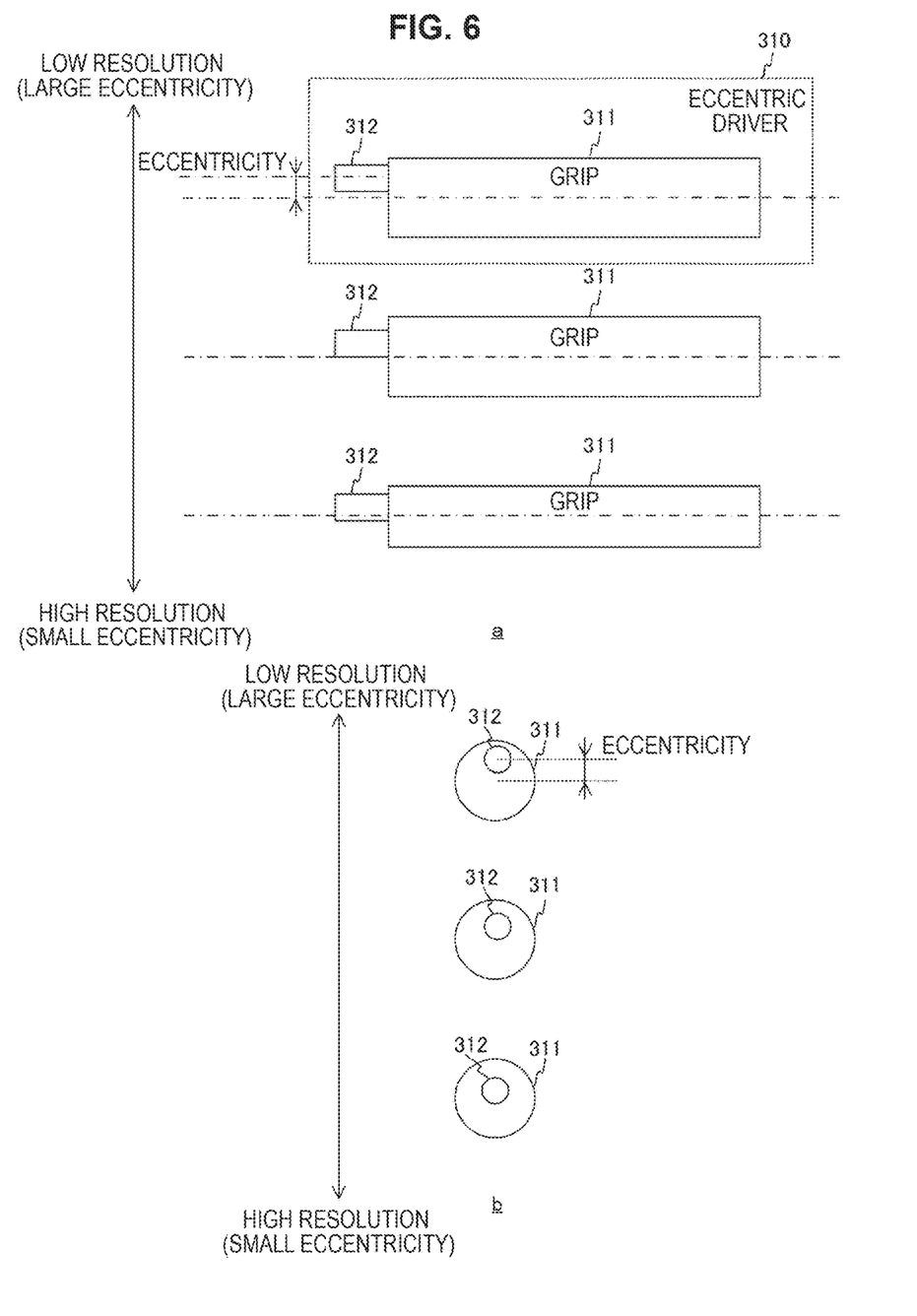

FIG. 6 includes FIGS. 6a and 6b showing an example of a side view and a cross sectional view, respectively, of eccentric drivers 310 in the first embodiment. It is suitable to prepare two or more of the eccentric drivers 310 in the adjustment of the unit substrate 211. Each eccentric driver 310 is provided with a grip 311 and a tip portion 312 of a rotation body.

The grip 311 is a portion where an operator grasps in the eccentric driver 310. The grip 311 has the tip portion 312 on one end. The diameter of the one end is smaller than the minor axis of the long hole 221 of the jig 220 and is larger than the diameter of the insertion port 213 of the unit substrate 211. In FIG. 6, the shape of the grip 311 is a cylindrical shape for convenience of illustration but is not limited to a cylindrical shape insofar as it is a rotation body.

The tip portion 312 is a rotation body in which the central axis is located on an axis different from the central axis of the grip 311. One end of the tip portion 312 is fixed to the grip 311. In the tip portion 312, the diameter of the other end which is not fixed to the grip 311 is smaller than the diameter of the insertion port 213 of the unit substrate 211.

Hereinafter, the distance between the central axis of the grip 311 and the central axis of the tip portion 312 is referred to as "eccentricity". Each of a plurality of eccentric drivers 310 has a different eccentricity.

Herein, the diameter of the tip portion 312 is smaller than the diameter of the insertion port 213 and the diameter of the one end of the grip 311 is smaller than the minor axis of the long hole 221 as described above. Therefore, an operator can insert the tip portion 312 into the insertion port 213 and can insert the one end of the grip 311 into the long hole 221. Thus, when an operator rotates the eccentric driver 310 in the state where the tip portion 312 and the grip 311 are inserted, the unit substrate 211 can move along the minor axis direction of the long hole 221, so that the position can be finely adjusted. The adjustment amount when the eccentric driver 310 is rotated at a fixed angle becomes larger as the eccentricity is larger. In other words, the resolution in the adjustment becomes lower as the eccentricity is larger.

Therefore, in the adjustment of the position, the resolution can be easily varied only by exchanging with the eccentric driver 310 with a different eccentricity. Thus, the position of the unit substrate 211 can be efficiently adjusted. For example, when the position shift amount is large, an operator adjusts the position halfway with the eccentric driver 310 having a low resolution (i.e., the eccentricity is large), and then the operator may adjust the position with the eccentric driver 310 having a high resolution (the eccentricity is small).

In FIG. 6, the diameter of each grip 311 of the plurality of eccentric drivers 310 is made the same and the position of the tip portion 312 is varied. However, the configuration is not limited thereto insofar as the eccentricity can be varied. For example, the positions of the tip portions 312 may be made the same and the diameter of each grip 311 of the plurality of eccentric drivers 310 may be varied. Both the position of the tip portion 312 and the diameter of the grip 311 may be varied.

Figure 7:
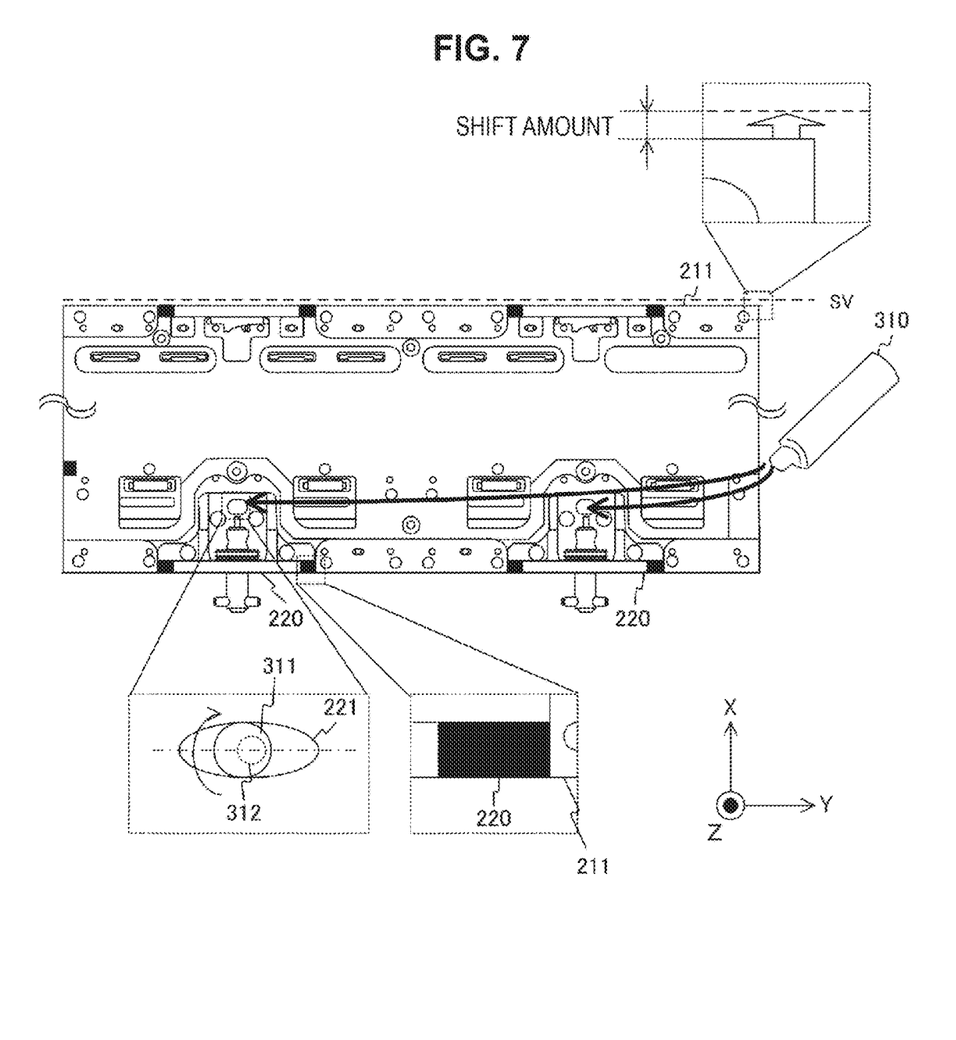
FIG. 7 is a view illustrating an example of the unit substrate before adjustment of position shift in the first embodiment.

FIG. 7 is a view illustrating an example of the unit substrates 211 before the adjustment in the first embodiment. The adjacent two unit substrates 211 are connected with the clamp and the screws 230 of the jig 220. A case where the short side of the unit substrates 211 fixed with the screws 230 shifts from the mechanical base line SV only by a fixed amount in this state is assumed. The unit substrates 211 in which the position shift occurs are targets to be adjusted.

First, an operator loosens the screws 230. Thus, the unit substrates 211 to be adjusted can be made movable within a fixed movable range in a direction orthogonal to the mechanical base line SV.

Subsequently, the operator inserts the tip portion 312 of the eccentric driver 310 into the insertion port 213 of the unit substrate 211 to be adjusted, and then inserts one end of the grip 311 into the long hole 221 of the jig 220. Herein, in the insertion, it is desirable to perform the insertion in such a manner that the distance between the central axis of the grip 311 and the major axis of the long hole 221 is shorter than the eccentricity. Then, the operator rotates the eccentric driver 310 until the short side of the unit substrates 211 is in agreement with the mechanical base line SV.

For example, when a pixel pitch is 1.26 mm (mm) and a ±3% accuracy thereof is demanded in order to maintain a fixed image quality, it is necessary to finely adjust the position of the unit substrates 211 with an accuracy of about ±40 μm. It is difficult for an operator to adjust the position with naked eyes with such accuracy. Therefore, it is desirable that a camera having an image pick-up unit and a display unit captures an image of the circumferential portion of the unit substrates 211, and then display the captured image on an enlarged scale. The operator finely adjusts the position while looking at the image to thereby increase the adjustment accuracy.

Figure 8:
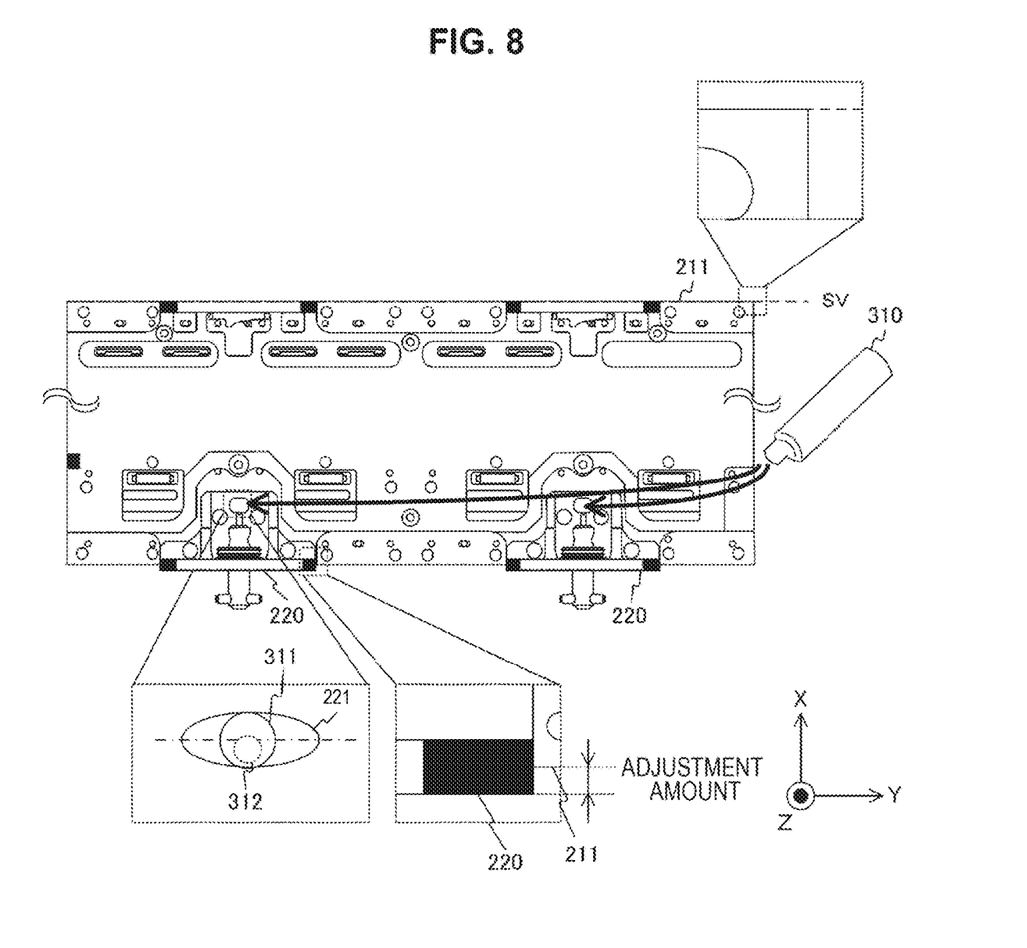
FIG. 8 is a view illustrating an example of the unit substrate after the adjustment of the position shift in the first embodiment.

FIG. 8 is a view illustrating an example of the unit substrates 211 after the adjustment in the first embodiment. The unit substrates 211 are adjusted to the base position specified by the mechanical base line SV by the rotation of the eccentric drivers 310. Thereafter, an operator tightens the screws 230 to fix the position of the unit substrates 211, and then remove the eccentric drivers 310.

Although an operator adjusts the position of the unit substrate 211, a robot may adjust the position in place of the operator.

Figure 9:
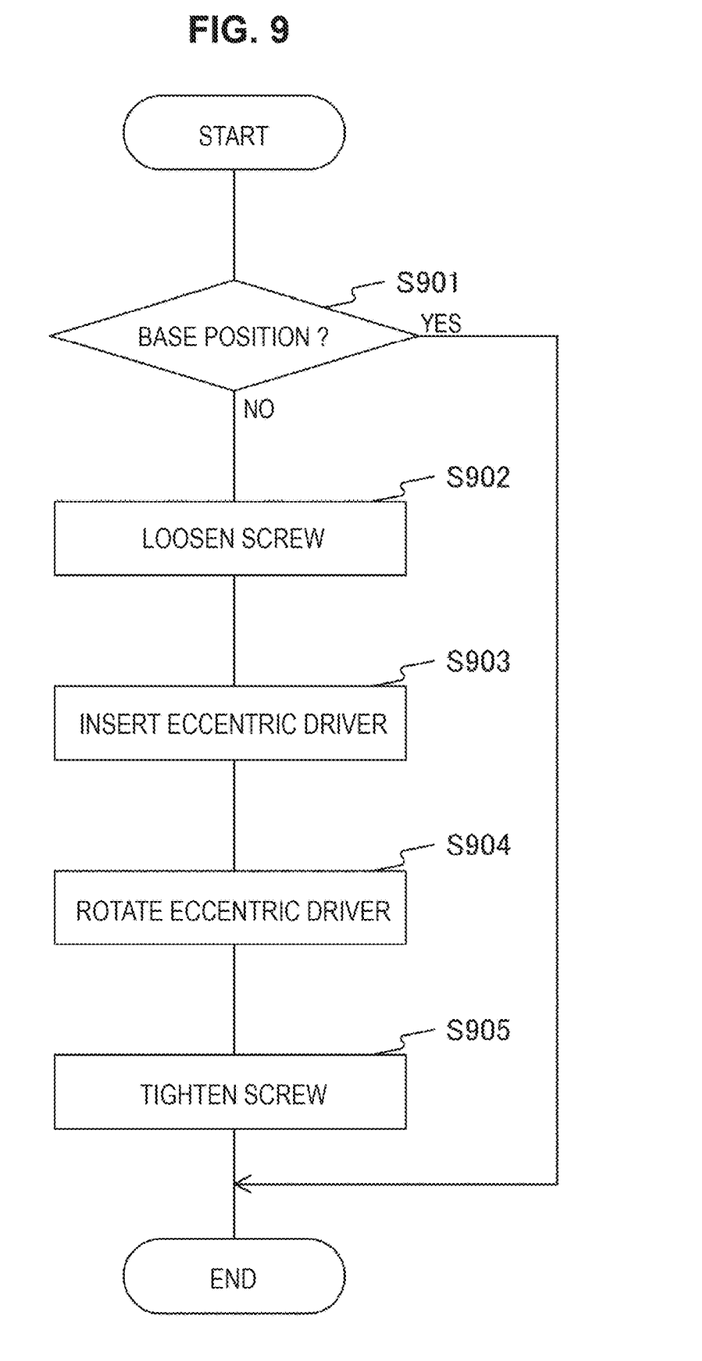
FIG. 9 is a flow chart showing an example of a unit substrate adjusting method in the first embodiment.

FIG. 9 is a flow chart showing an example of a method for adjusting the unit substrates 211 in the first embodiment. The adjustment operation shown in FIG. 9 is performed whenever the unit substrate 211 is disposed.

An operator judges whether the position of the disposed unit substrate 211 is the base position specified by the mechanical base lines SV and SH (Step S901). When the position is not the base position (Step S901: No), the operator loosens the screws 230 of the jig 220 (Step S902).

Then, the operator inserts the tip portion 312 of the eccentric driver 310 into the insertion port 213 of the unit substrate 211 to be adjusted, and then inserts one end of the grip 311 into the long hole 221 of the jig 220 (Step S903). The operator rotates the inserted eccentric driver 310 to finely adjust the position of the unit substrate 211 to the base position (Step S904). The operator tightens the screws 230 of the jig 220 to fix the position of the unit substrate 211, and then remove the eccentric driver 310 (Step S905). When the position of the unit substrate 211 is the base position (Step S901: Yes) or after Step S905, the operator completes the adjustment operation of the position of the unit substrates 211.

Thus, according to the first embodiment of the present technology, the insertion port into which the tip portion of the eccentric driver is inserted is provided in the jig and the long hole into which the grip of the eccentric driver is inserted is provided in the substrate, and therefore the position of the substrate can be correctly adjusted by the insertion and the rotation of the eccentric drivers.

2. Second Embodiment

In the first embodiment, heat generated in the display unit 210 is dissipated to the adjacent display unit 210 by the jig 220. However, the heat generation amount of the display unit 210 further increases with an increase in the density of light emitting elements in the display unit 210. Therefore, there is a possibility that when the heat dissipation amount by the jig 220 is low relative to the increased heat generation amount, the temperature of the entire display portion 200 does not become uniform, and then distortion may occur in the display portion 200 due to thermal expansion of the display units 210 in which the temperature becomes high. Therefore, it is desirable to further provide a heat dissipation unit for dissipating the heat of the display unit 210. The display device 100 of the second embodiment is different from that of the first embodiment in the respect that the heat dissipation unit is further provided.

Figure 10:
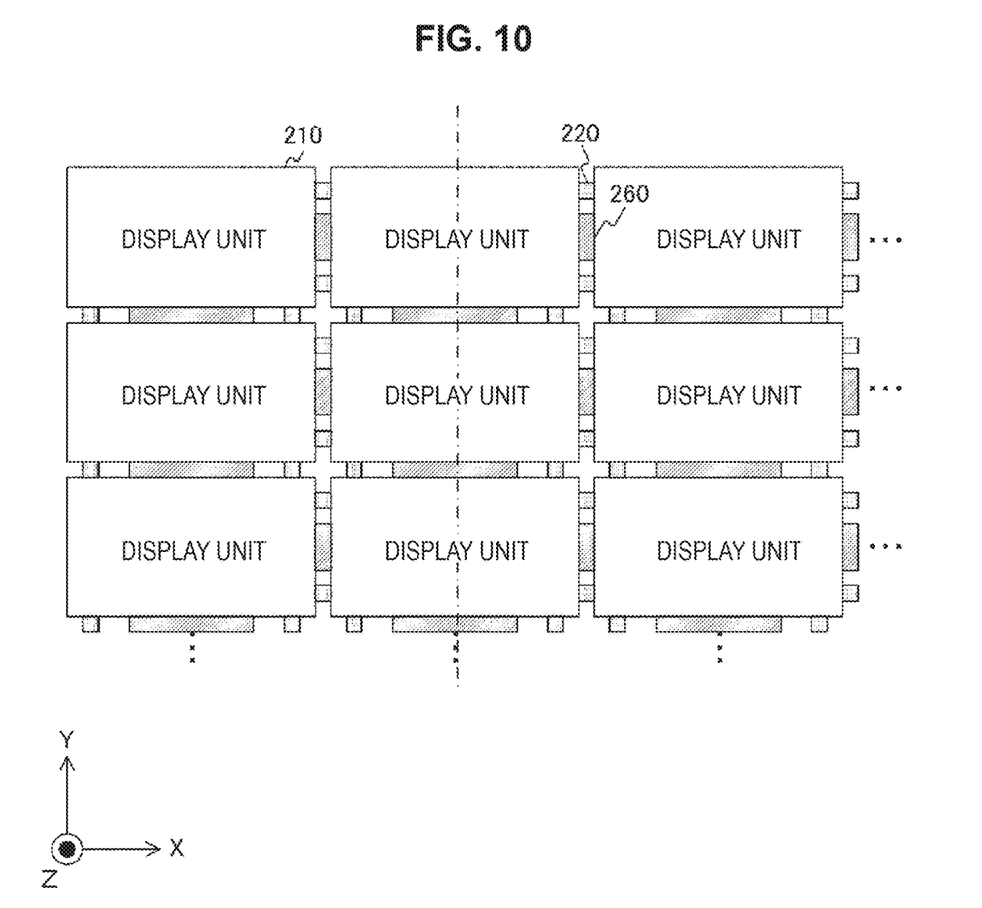
FIG. 10 is an example of a plan view of a display portion in a second embodiment.

FIG. 10 shows an example of a plan view of a display portion 200 in the second embodiment. In the display portion 200 of the second embodiment, heat dissipation units 260 are provided between the adjacent display units 210 in such a manner as to contact the display units 210 in a fixed area.

The heat dissipation unit 260 dissipates heat generated in the display unit 210 to the outside (for example, the adjacent display unit 210). For example, a heat dissipation sheet, metal, or the like whose heat conductivity is higher than a fixed value is used as the heat dissipation unit 260.

Figure 11:
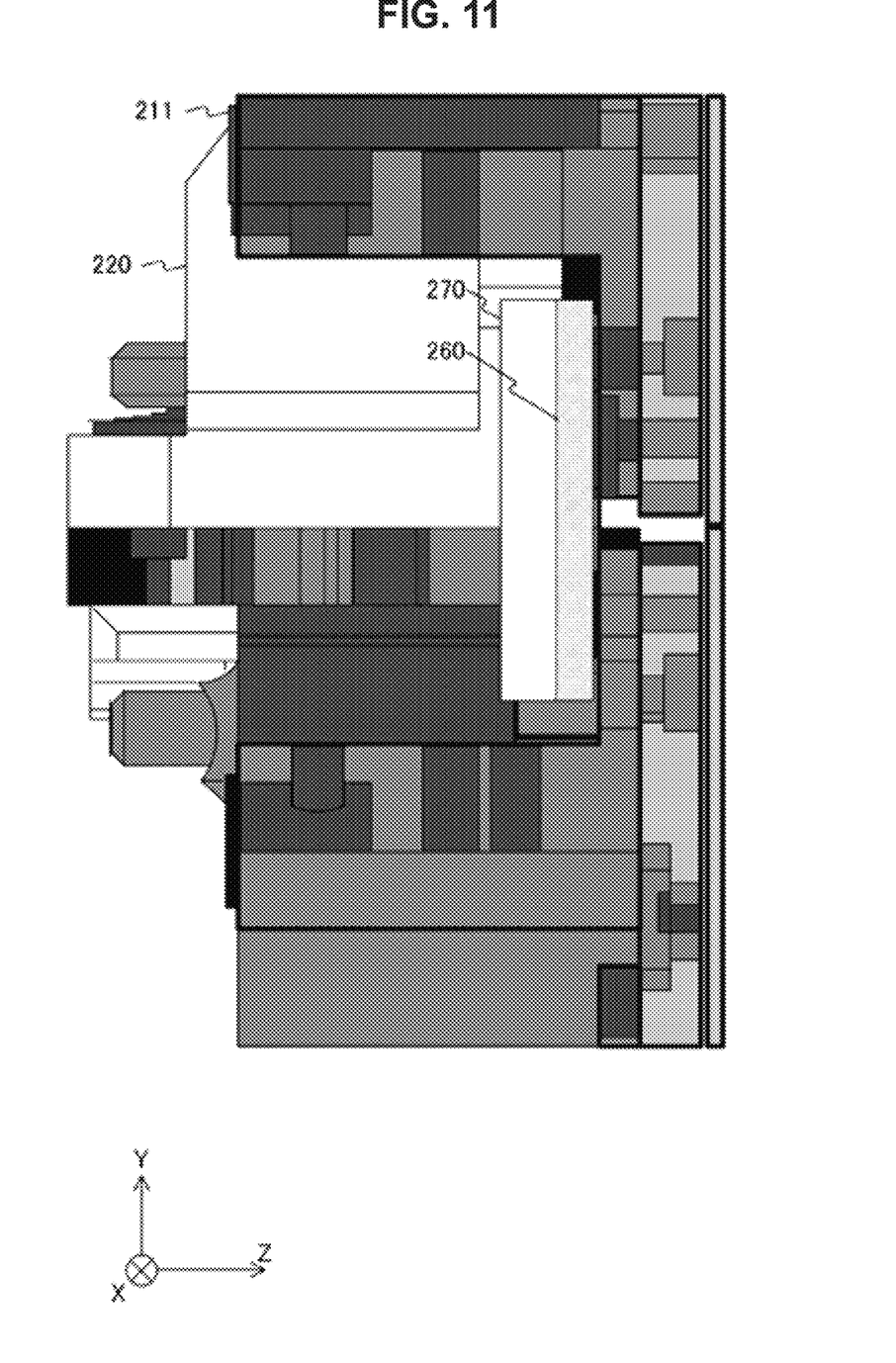
FIG. 11 is an example of a cross sectional view of the display portion in the second embodiment.

FIG. 11 shows an example of a cross sectional view of the display portion 200 in the second embodiment. The heat dissipation unit 260 has a sheet shape and contacts each of the adjacent unit substrates 211 in a fixed area. The heat dissipation unit 260 is fixed with a fixation sheet 270. As the length of the contact surface of the heat dissipation unit 260 and the unit substrate 211 is longer, the area of the contact surface becomes larger. Therefore, it is desirable that the heat dissipation unit 260 and the unit substrate 211 contact over the entire side thereof. However, when the heat dissipation unit 260 is brought into contact with the unit substrate 211 on the entire side, the surface accuracy may not be made sufficiently high. Therefore, the side length of the unit attachment unit 212 and the jig 220 is desirably up to about 100 mm from the viewpoint of the mechanical accuracy. By connecting the sides other than the sides with the heat dissipation unit 260 and the fixation sheet 270, the heat dissipation properties are secured.

Thus, according to the second embodiment, since the heat dissipation units 260 dissipate heat generated in the display units 210, the temperature of the entire display portion 200 can be made uniform. Thus, temperature unevenness does not occur, and the distortion occurring in the display portion 200 due to the thermal expansion of the hot display units 210 can be suppressed.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disk), a memory card, and a Blu-ray disc (registered trademark) can be used.

In addition, the effects described in the present specification are not limiting but are merely examples, and there may be additional effects.

Additionally, the present technology may also be configured as below.

(1) A display device including:
a jig that is provided with an insertion port into which a tip portion of an eccentric driver having the tip portion on an axis different from a central axis of a grip is inserted;
a substrate that is provided with a long hole into which the grip is inserted, the long hole being long and narrow, a position of the substrate relative to the jig being movable within a predetermined movable range by rotation of the eccentric driver, the tip portion and the grip of the eccentric driver being inserted; and
a base position fixing unit that fixes the substrate to a predetermined base position within the movable range.

(2) The display device according to (1),
wherein the substrate has a rectangular shape,
wherein a plurality of the insertion ports are arranged along a side of the substrate, and
wherein the jig is provided in each insertion port.

(3) The display device according to (2),
wherein the plurality of insertion ports and a plurality of the jigs are provided on each side of the substrate.

(4) The display device according to any one of (1) to (3), further including:
a heat dissipation unit that dissipates heat generated in the substrate to an outside of the substrate.

(5) The display device according to any one of (1) to (4), further including:
an external fixing unit that fixes the jig to a member at an outside of the substrate.

(6) The display device according to any one of (1) to (5), further including:
a display panel that is attached to the substrate; and
a control unit that displays an image on the display panel.

(7) An electronic device including:
a jig that is provided with an insertion port into which a tip portion of an eccentric driver having the tip portion on an axis different from a central axis of a grip is inserted;
a substrate that is provided with a long hole into which the grip is inserted, the long hole being long and narrow, a position of the substrate relative to the jig being movable within a predetermined movable range by rotation of the eccentric driver, the tip portion and the grip of the eccentric driver being inserted; and
a base position fixing unit that fixes the substrate to a predetermined base position within the movable range.

(8) A substrate adjusting method by an electronic device including a jig that is provided with an insertion port into which a tip portion of an eccentric driver having the tip portion on an axis different from a central axis of a grip is inserted, a substrate that is provided with a long hole into which the grip is inserted, the long hole being long and narrow, a position of the substrate relative to the jig being movable within a predetermined movable range by rotation of the eccentric driver, the tip portion and the grip of the eccentric driver being inserted, and a base position fixing unit that fixes the substrate to a predetermined base position within the movable range, the substrate adjusting method including:
inserting the tip portion into the insertion port and inserting the grip into the long hole;
rotating the eccentric driver, the tip portion and the grip of the eccentric driver being inserted; and
fixing, after the rotating, the substrate to the base position with the base position fixing unit.

What is claimed is:
1. A display device comprising:
a plurality of display units;
a plurality of jigs;
a plurality of lids; and
wherein the plurality of display units are mounted on each of the plurality of lids by the plurality of jigs,
wherein each of the plurality of display units configured to include a substrate, a plurality of panel attachment plates and a plurality of display panels,
wherein a plurality of insertion ports are arranged along a side of the substrate, and
wherein each of the plurality of jigs is provided in each insertion port.

2. The display device according to claim 1, wherein the insertion port into which a tip portion of an eccentric driver having the tip portion on an axis different from a central axis of a grip is inserted.

3. The display device according to claim 1, wherein the substrate that is provided with a long hole into which the grip is inserted, the long hole being long and narrow, a position of the substrate relative to the plurality of jigs being movable within a predetermined movable range by rotation of the eccentric driver, the tip portion and the grip of the eccentric driver being inserted.

4. The display device according to claim 1, further comprising:
a base position fixing unit that fixes the substrate to a predetermined base position within the movable range.

5. The display device according to claim 1, further comprising:
a heat dissipation unit that dissipates heat generated in the substrate to an outside of the substrate.

6. The display device according to claim 1, further comprising:
a display panel that is attached to the substrate; and
a control unit that displays an image on the display panel.

7. A display device comprising:
a plurality of display units;
a plurality of jigs;
a plurality of lids; and
wherein the plurality of display units are mounted on each of the plurality of lids by the plurality of jigs, and an external fixing unit that fixes the jig to a member at an outside of a substrate.

* * * * *